(12) United States Patent
Wang et al.

(10) Patent No.: US 11,067,763 B2
(45) Date of Patent: Jul. 20, 2021

(54) INTEGRATED PACKAGED LIGHT ENGINE AND SIGNAL TRANSMITTING AND RECEIVING METHOD THEREOF

(71) Applicant: HANGZHOU MO-LINK TECHNOLOGY CO. LTD, Hangzhou (CN)

(72) Inventors: Hao Wang, Hangzhou (CN); Dong Wang, Hangzhou (CN)

(73) Assignee: HANGZHOU MO-LINK TECHNOLOGY CO. LTD, Hangzhou (CN)

( * ) Notice: Subject to any disclaimer, the term of this patent is extended or adjusted under 35 U.S.C. 154(b) by 0 days.

(21) Appl. No.: 16/807,271

(22) Filed: Mar. 3, 2020

(65) Prior Publication Data

US 2021/0084754 A1    Mar. 18, 2021

(30) Foreign Application Priority Data

Sep. 18, 2019    (CN) .......................... 201910882619.2

(51) Int. Cl.
*G02B 6/42* (2006.01)
*H05K 1/02* (2006.01)

(52) U.S. Cl.
CPC ......... *G02B 6/4246* (2013.01); *G02B 6/4249* (2013.01); *G02B 6/4257* (2013.01);
(Continued)

(58) Field of Classification Search
None
See application file for complete search history.

(56) References Cited

U.S. PATENT DOCUMENTS 9,581,776 B1 *    2/2017  Lee .................. G02B 6/4206
2002/0175339 A1 * 11/2002  Raj .................. G02B 6/4214
                                                       257/99

(Continued)

FOREIGN PATENT DOCUMENTS

JP        10-197762 A  *  7/1998

OTHER PUBLICATIONS

English translation of office action in Chinese application 201910882619. 2, dated May 25, 2020. (Year: 2020).*

*Primary Examiner* — Michael Stahl
(74) *Attorney, Agent, or Firm* — Li & Cai Intellectual Property (USA) Office

(57) ABSTRACT

Disclosed are an integrated packaged light engine and signal emitting and receiving method thereof. The light engine includes molded interconnection device in which ceramic substrate is embedded, laser chip, photodiode chip, optical driving chip, transimpedance amplifier chip, array lens module and optical fiber interface provided on the ceramic substrate; the signal transmitting method includes: S1, powering optical drive chip by external power supply; S2, transmitting external signal to optical drive chip, so that laser chip emits optical signal; S3, totally reflecting and then transmitting optical signal by array lens module. The signal receiving method includes: S1, optical signal entering optical fiber interface; S2, optical signal entering array lens module; S3, transmitting optical signal to photodiode chip by array lens module; S4, converting and then transmitting optical signal into electrical signal to transimpedance amplifier chip by photodiode chip; S5, transmitting electrical signal to external circuit by transimpedance amplifier chip.

10 Claims, 3 Drawing Sheets

(52) U.S. Cl.
CPC ............ *G02B 6/4204* (2013.01); *G02B 6/428* (2013.01); *G02B 6/4214* (2013.01); *H05K 1/025* (2013.01); *H05K 1/0274* (2013.01); *H05K 2201/10174* (2013.01)

(56) References Cited

U.S. PATENT DOCUMENTS

| | | | | |
|---|---|---|---|---|
| 2003/0159280 | A1* | 8/2003 | Young | H01S 5/06804 29/840 |
| 2005/0185882 | A1* | 8/2005 | Zack | G02B 6/4256 385/15 |
| 2005/0189549 | A1* | 9/2005 | Malone | G02B 6/4201 257/82 |
| 2005/0213994 | A1* | 9/2005 | Dudek | G02B 6/4201 398/202 |
| 2005/0265670 | A1* | 12/2005 | Sasser | G02B 6/4201 385/92 |
| 2008/0226228 | A1* | 9/2008 | Tamura | G02B 6/4214 385/33 |
| 2008/0298814 | A1* | 12/2008 | Epitaux | G02B 6/4249 398/200 |
| 2011/0123151 | A1* | 5/2011 | Zbinden | G02B 6/4214 385/33 |
| 2012/0063718 | A1* | 3/2012 | Steijer | G02B 6/4201 385/14 |
| 2012/0241795 | A1* | 9/2012 | Chang | G02B 6/4214 257/98 |
| 2014/0314424 | A1* | 10/2014 | Sheu | G02B 6/4214 398/139 |
| 2017/0126318 | A1* | 5/2017 | Chang | G02B 6/4214 |
| 2017/0269316 | A1* | 9/2017 | Chang | G02B 6/425 |
| 2019/0033542 | A1* | 1/2019 | Epitaux | G02B 6/3518 |

\* cited by examiner

INTEGRATED PACKAGED LIGHT ENGINE AND SIGNAL TRANSMITTING AND RECEIVING METHOD THEREOF

FIELD OF THE DISCLOSURE

The disclosure relates to the field of information transmission, in particular to an integrated packaged light engine and a signal transmitting and receiving method thereof.

BACKGROUND OF THE DISCLOSURE

With the increasing transmission capacity in the field of communication, it has been difficult to meet the requirements of transmission capacity and transmission speed by mean of the traditional transmission technology. At present, there is an increasing demand for bandwidth of electronic products, and the applications have become diversified. A light engine is a main component of an optical transceiver module, to make the light engine in the prior art, firstly, devices such as an electrical interface, a driving controller, a laser chip, a photodiode chip, a receiving chip, an array lens module and an optical fiber array are purchased based on application requirements, and then each device is arranged on a PCB; in this way, all the PCB boards, circuits and optical circuits need to be redesigned and developed for different application requirements, causing the problems of long development time, high cost and the like.

SUMMARY OF THE DISCLOSURE

To solve the above problems, the present disclosure provides an integrated packaged light engine which is easy to assemble and efficient and a signal transmitting and receiving method thereof.

In order to achieve the above object, the technical solution of the disclosure is as follows:

In one aspect, the present disclosure provides an integrated packaged light engine, which includes a molded interconnection device, a ceramic substrate, a laser chip, a photodiode chip, an optical drive chip, a transimpedance amplifier chip, an array lens module and an optical fiber interface, wherein the molded interconnection device is fixedly connected on a PCB, the molded interconnection device is embedded with the ceramic substrate, and the ceramic substrate is provided with the laser chip, the photodiode chip, the optical drive chip, the transimpedance amplifier chip, the array lens module and the optical fiber interface; the surface of the molded interconnection device is provided with a power supply circuit and a signal circuit, the surface of the ceramic substrate is provided with a connecting circuit, the metal pins of the optical drive chip and the transimpedance amplifier chip are respectively connected with the connecting circuit on the surface of the ceramic substrate; the laser chip is electrically connected with the optical drive chip, the photodiode is electrically connected with the transimpedance amplifier chip, and the metal pin of the optical drive chip and the connecting circuit on the surface of the ceramic substrate are all connected with the power supply circuit and the signal circuit on the surface of the molded interconnection device.

Further, the optical fiber interface employs an optical fiber interface in the form of an optical fiber array for connection to a single-mode optical fiber, a multi-mode optical fiber, or a plastic optical fiber.

Further, an optical fiber array is integrated on the array lens module.

Further, the array lens module and the optical fiber interface can transmit optical signals bidirectionally.

Furthermore, the molded interconnection device is provided with two high-precision holes (the high precision includes hole spacing and hole diameter, the best tolerance being preferably less than 5 um, and 15 um being acceptable).

Furthermore, the array lens module is provided with two high-precision PIN columns (the high precision includes a PIN column spacing and a PIN column diameter, the best tolerance being preferably less than 5 um and 15 um being acceptable).

Furthermore, the two high-precision PIN columns of the array lens module are aligned with the two holes of the molded interconnection device to achieve passive coupling.

Furthermore, the array lens module includes a lens body (at least one or more), wherein a 45-degree reflecting surface is arranged on the lens body, a plurality of optical fiber interfaces (at least one) are arranged on the side of the lens body side by side, a first lens is arranged in each optical fiber interface, a second lens is arranged at the bottom of the lens body side by side, the first lens and the second lens correspond to each other, and an optical signal entering from the first lens is reflected by the reflecting surface and then emitted from the second lens.

When installation, the ceramic substrate is placed in the molded interconnection device and fixed by glue. A coordinate system is established by utilizing the two holes at the edge of the molded interconnection device, then under the coordinate system, a laser chip, a photodiode chip, an optical drive chip and a transimpedance amplifier chip are arranged on a designated position by means of diebond, and fixed on a ceramic substrate by silver glue. Each part is connected by means of wire bond.

The fibers are cut using a blade or laser cutter, and correspondingly inserted into the array lens module, and fixed inside the array lens module by glue.

In one aspect, the present disclosure provides a method for signal transmitting of a light engine includes the following steps:

S1, powering the optical drive chip by an external power supply through a power supply circuit on the surface of the molded interconnection device and a connecting circuit on the surface of the ceramic substrate;

S2, transmitting an external signal to an optical drive chip through a signal circuit on the surface of the molded interconnection device and a connecting circuit on the surface of the ceramic substrate, the optical drive chip driving the laser chip to emit an optical signal; and S3, collimating, totally reflecting and converging the optical signal emitted from the laser chip by the array lens module, then transmitting it through the optical fiber interface and the optical fiber connected with the optical fiber interface, to complete the signal transmitting operation of the light engine.

In one aspect, the present disclosure provides a method for signal receiving of a light engine includes the following steps:

S1, an optical signal entering an optical fiber interface over an optical fiber connected with the optical fiber interface;

S2, the optical signal entering the array lens module after leaving the optical fiber interface;

S3, collimating, totally reflecting and converging the optical signal by the array lens module, then transmitting it to the photodiode chip;

S4, powering the transimpedance amplifier chip by an external power supply through the power supply circuit on the surface of the molded interconnection device and the connecting circuit on the surface of the ceramic substrate; and S5, converting the optical signal into an electrical signal then transmitting it to the transimpedance amplifier by the photodiode chip, the transimpedance amplifier chip transmitting the electrical signal to an external circuit through the power supply circuit on the surface of the molded interconnection device and the connecting circuit on the surface of the ceramic substrate, to complete the signal receiving operation of the light engine.

Therefore, compared with the prior art, the disclosure has the advantages and positive effects in that:

the present optical engine integrates devices for transmitting and receiving optical signals together, so that the standardization of the optical engine can be realized, the design is simplified, and different application requirements are met; when in use, the light engine is directly connected with an external circuit, so that the light signal can be transmitted and received, the development time of the light engine is effectively shortened, and the development cost is reduced. On the other hand, the optical fiber interface of the present disclosure adopts an optical fiber interface in the form of an optical fiber array, so that the density of electrical interconnection and optical interconnection can be improved, the bandwidth capacity and the communication capacity can be integrally improved, and the working efficiency of a light engine is effectively improved.

BRIEF DESCRIPTION OF THE DRAWINGS

In order to more clearly illustrate the embodiments of the present disclosure or the technical schemes in the prior art, the drawings used in the description of the embodiments or the prior art will be briefly described below. Obviously, the drawings depicted hereinafter are only some embodiments of the present disclosure, and those skilled in the art would obtain drawings of other embodiments from the drawings herein without involving any inventive effort.

DETAILED DESCRIPTION OF THE EXEMPLARY EMBODIMENTS

The technical solutions in the embodiments of the application will be described clearly and completely below with reference to the accompanying drawings of the embodiments of the application. Apparently, the embodiments described herein are only some embodiments of the application, but not all of embodiments. Based on the embodiments of the present disclosure, all other embodiments, modifications, equivalents, improvements, and the like, which would occur to one of ordinary skill in the art without involving any inventive effort, are intended to be included within the scope of the present disclosure.

Figure 1:
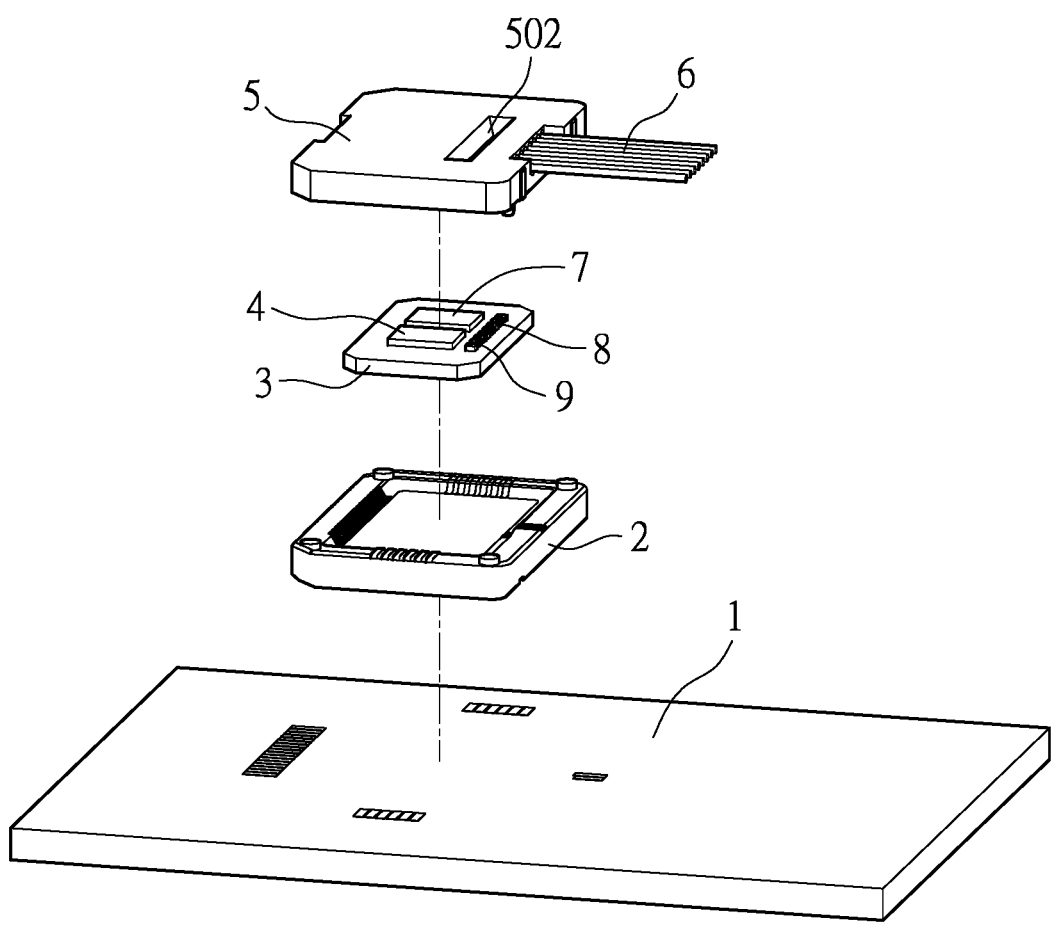
FIG. 1 is an assembly structure diagram of a light engine.
Figure 2:
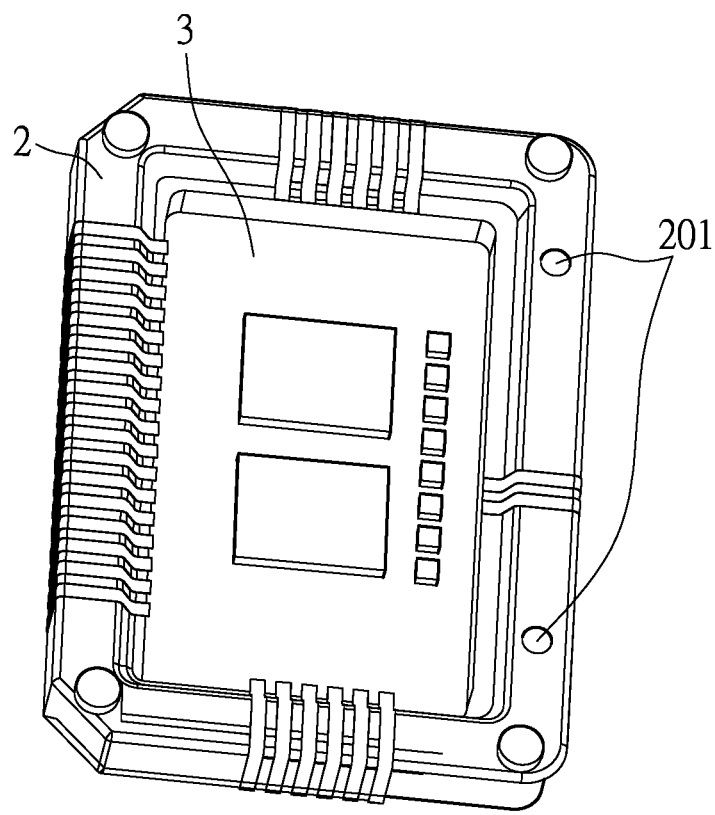
FIG. 2 is a connection structure diagram of a molded interconnection device and a ceramic substrate.
Figure 3:
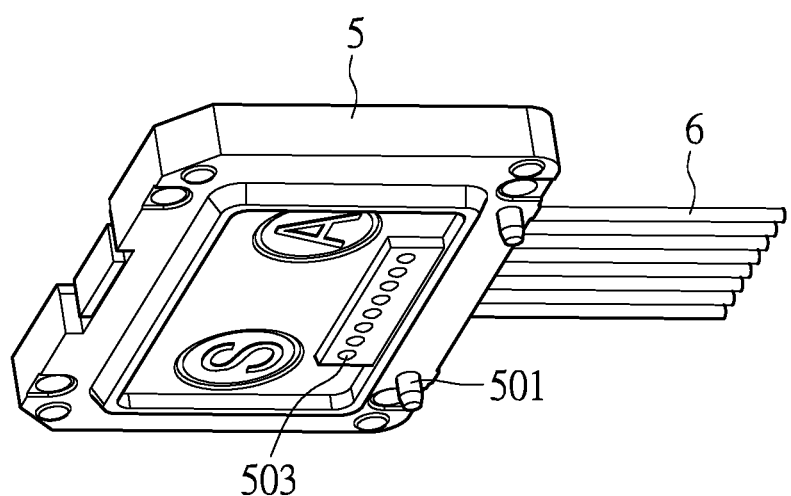
FIG. 3 is a schematic diagram showing the structure of an array lens module.
Figure 4:
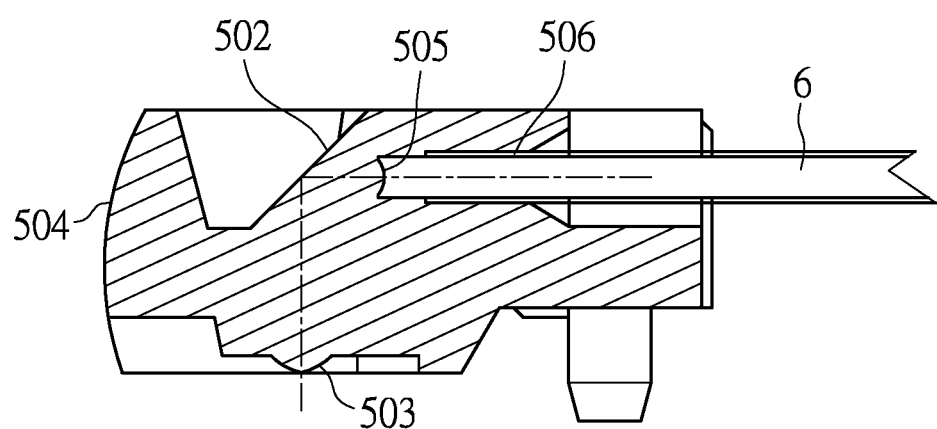
FIG. 4 is a reflection diagram of an array lens module.

As shown in FIGS. 1 to 4, the light engine of the present disclosure includes a molded interconnection device (MID) 2, a ceramic substrate 3 embedded in the molded interconnection device 2, and a laser chip (LD) 9, a photodiode chip (PD) 8, an optical driver chip (Driver) 4, a transimpedance amplifier chip (TIA) 7, an array lens module (ArrayLens) 5 and a fiber interface 506 provided on the ceramic substrate 3. A circuit fabricated by applying a laser direct structuring (LDS) technology is arranged on the surface of the molded interconnection device 2; a printed circuit is arranged on the ceramic substrate 3; the laser chip 9 and the photodiode 8 are fixed on the ceramic substrate 3 by applying a diebond technology; the laser chip 9 is connected with the optical driver chip 4 (Driver) through a gold wire by applying a wirebond technology; the photodiode chip 8 is connected with the transimpedance amplifier chip (TIA) 7 through a gold wire by applying a wirebond technology; the metal pins of the optical driver chip (Driver) 4 and the transimpedance amplifier chip (TIA) 7 are connected with the circuit on the surface of the ceramic substrate 3 by applying a wirebond technology; the circuit on the surface of the ceramic substrate 3 is connected with the circuit on the surface of the molded interconnection device 2 through a gold wire by applying a wirebond technology, the circuit on the surface of the ceramic substrate 3 and the circuit on the surface of the molded interconnection device 2 being all common circuits in the market.

The molded interconnection device 2 is provided with two high-precision holes 201 (the high precision includes hole spacing and hole diameter, the tolerance being preferably less than 5 um and 15 um being acceptable); the array lens module 5 is provided with two high-precision PIN columns 501 (the high precision includes a PIN column spacing and a PIN column diameter, and the tolerance being preferably less than 5 um and 15 um being acceptable); the two high-precision PIN columns 501 of the array lens module 5 are aligned with the two holes 201 of the molded interconnection device 2 to achieve passive coupling.

The molded interconnection device (MID) 2 is mounted on the PCB board 1, which is directly molded by a laser direct structuring (LDS) technology capable of integrating high frequency, mechanical and electrical functions into a 3D assembly.

The optical fiber interface 506 is applied in the form of an optical fiber array for connection to a single-mode optical fiber or a multi-mode optical fiber; the optical fibers of the optical fiber array are used for transmitting optical signals.

The array lens module 5 and the optical fiber array can transmit signals bidirectionally.

The array lens module includes a lens body 504 (at least one or more), wherein a 45-degree reflecting surface 502 is arranged on the lens body 504, a plurality of optical fiber interfaces 506 (at least one) are arranged side by side on the side surface of the lens body 504, optical fibers 6 are inserted into the optical fiber interfaces, a first lens 505 is arranged in each optical fiber interface 506, and a second lens 503 is arranged at the bottom of the lens body 504 side by side, the first lens 505 and the second lens 503 correspond to each other and an optical signal entering from the first lens is reflected by the reflecting surface and then emitted from the second lens.

The array lens module 5 is an array lens optical fiber module, namely an optical fiber array is integrated on the array lens module 5; the array lens optical fiber module integrates the lens and the optical fibers, and the optical fibers are directly inserted into corresponding holes of the lens, so that the optical fiber array is reduced; based on different fiber types, such as 125 um outer diameter glass fiber, 250 um out-of-band coated glass fiber, 250 um plastic fiber, and the like, array lens fiber modules are fabricated with different apertures to accommodate those different fiber types.

When carrying out a signal transmitting operation by the light engine, the method includes the following steps:

S1, powering the optical drive chip 4 by an external power supply through the power supply circuit on the surface of the molded interconnection device 2 and the connecting circuit on the surface of the ceramic substrate 3;

S2, transmitting an external signal to the optical drive chip 4 through the signal circuit on the surface of the molded interconnection device 2 and the connecting circuit on the surface of the ceramic substrate 3, the optical drive chip 4 driving the laser chip 9 to emit an optical signal; and S3, collimating, totally reflecting and converging the optical signal emitted from the laser chip 9 by the array lens module 5, then transmitting it through the optical fiber interface and the optical fiber 6 connected with the optical fiber interface, to complete the signal transmitting operation of the light engine.

When carrying out a signal receiving operation by the light engine, the method includes the following steps:

S1, an optical signal enters an optical fiber interface over the optical fiber 6 connected with the optical fiber interface;

S2, the optical signal enters the array lens module 5 after leaving the optical fiber interface;

S3, collimating, totally reflecting and converging the optical signal by the array lens module, then transmitting it to the photodiode chip;

S4, powering the transimpedance amplifier chip 7 by an external power supply through the power supply circuit on the surface of the molded interconnection device 2 and the connecting circuit on the surface of the ceramic substrate 3; and S5, converting the optical signal into an electrical signal then transmitting it to the transimpedance amplifier 7 by the photodiode chip 8, the transimpedance amplifier chip 7 transmitting the electrical signal to an external circuit through the power supply circuit on the surface of the molded interconnection device and the connecting circuit on the surface of the ceramic substrate, to complete the signal receiving operation of the light engine.

In conclusion, according to the disclosure, the light engine integrates devices for transmitting and receiving optical signals together, so that the standardization of the optical engine can be realized, the design is simplified, and different application requirements are met; when in use, the light engine is directly connected with an external circuit, so that the light signal can be transmitted and received, the development time of the light engine is effectively shortened, and the development cost is reduced. On the other hand, the optical fiber interface of the present disclosure adopts an optical fiber interface in the form of an optical fiber array, so that the density of electrical interconnection and optical interconnection can be improved, thus the bandwidth capacity and the communication capacity can be integrally improved, and the working efficiency of the light engine is effectively improved.

What is claimed is:

1. An integrated packaged light engine, characterized in that: the light engine comprises a molded interconnection device, a ceramic substrate, a laser chip, a photodiode chip, an optical drive chip, a transimpedance amplifier chip, an array lens module and an optical fiber interface, wherein the molded interconnection device is fixedly connected on a PCB, the molded interconnection device is embedded with the ceramic substrate, and the ceramic substrate is provided with the laser chip, the photodiode chip, the optical drive chip, the transimpedance amplifier chip, the array lens module and the optical fiber interface; a surface of the molded interconnection device is provided with a power supply circuit and a signal circuit, a surface of the ceramic substrate is provided with a connecting circuit, a plurality of metal pins of the optical drive chip and the transimpedance amplifier chip are respectively connected with the connecting circuit on the surface of the ceramic substrate; the laser chip is electrically connected with the optical drive chip, the photodiode is electrically connected with the transimpedance amplifier chip, and the plurality of metal pins of the optical drive chip and the connecting circuit on the surface of the ceramic substrate are all connected with the power supply circuit and the signal circuit on the surface of the molded interconnection device.

2. The integrated packaged light engine of claim 1, characterized in that: the optical fiber interface adopts an optical fiber interface in the form of an optical fiber array for connection to a single-mode optical fiber, a multi-mode optical fiber or a plastic optical fiber.

3. The integrated packaged light engine of claim 1, characterized in that: an optical fiber array is integrated on the array lens module.

4. The integrated packaged light engine of claim 1, characterized in that: both the array lens module and the optical fiber interface can transmit optical signals bidirectionally.

5. The integrated packaged light engine of claim 1, characterized in that: the molded interconnection device is provided with two high-precision holes.

6. The integrated packaged light engine of claim 5, characterized in that: two high-precision PIN columns are provided on the array lens module.

7. The integrated packaged light engine of claim 6, characterized in that: the two high-precision PIN columns of the array lens module correspond to the two holes of the molded interconnection device.

8. The integrated packaged light engine of claim 6, characterized in that: the array lens module comprises a lens body, wherein a 45-degree reflecting surface is provided on the lens body, a plurality of optical fiber interfaces are provided on a side of the lens body side by side, a first lens is provided in each optical fiber interface, a second lens is provided at a bottom of the lens body side by side, wherein the first lens and the second lens correspond to each other, and an optical signal entering from the first lens is reflected by the reflecting surface and then emitted from the second lens.

9. A method for signal transmitting of a light engine, the light engine being the light engine of claim 1, characterized in that: the method comprises the following steps:

S1, powering the optical drive chip by an external power supply through a power supply circuit on the surface of the molded interconnection device and a connecting circuit on the surface of the ceramic substrate;

S2, transmitting an external signal to an optical drive chip through a signal circuit on the surface of the molded interconnection device and a connecting circuit on the surface of the ceramic substrate, the optical drive chip driving the laser chip to emit an optical signal; and S3, collimating, totally reflecting and converging the optical signal emitted from the laser chip by the array lens module, then transmitting it through the optical fiber interface and the optical fiber connected with the optical fiber interface, to complete the signal emission operation of the light engine.

10. A method for signal receiving of a light engine, the light engine being the light engine of claim 1, characterized in that: the method comprises the following steps:

S1, an optical signal entering an optical fiber interface connected with an optical fiber over the optical fiber;

S2, the optical signal entering into the array lens module after leaving the optical fiber interface;

S3, collimating, totally reflecting and converging the optical signal by the array lens module, then transmitting it to the photodiode chip;

S4, powering the transimpedance amplifier chip by an external power supply through a power supply circuit on the surface of the molded interconnection device and a connecting circuit on the surface of the ceramic substrate; and S5, converting the optical signal into an electrical signal then transmitting it to the transimpedance amplifier chip by the photodiode chip, the transimpedance amplifier chip transmitting the electrical signal to an external circuit through the power supply circuit on the surface of the molded interconnection device and the connecting circuit on the surface of the ceramic substrate, to complete the signal receiving operation of the light engine.

\* \* \* \* \*